United States Patent [19]
Kim

[11] Patent Number: 5,945,712
[45] Date of Patent: Aug. 31, 1999

[54] SEMICONDUCTOR DEVICE HAVING A SOI STRUCTURE WITH SUBSTRATE BIAS FORMED THROUGH THE INSULATOR AND IN CONTACT WITH ONE OF THE ACTIVE DIFFUSION LAYERS

[75] Inventor: Jae-Kap Kim, Kyoungki-do, Rep. of Korea

[73] Assignee: Hyundai Electronics Industries Co., Ltd., Kyoungki-do, Rep. of Korea

[21] Appl. No.: 08/881,944

[22] Filed: Jun. 25, 1997

[30] Foreign Application Priority Data

Jun. 29, 1996 [KR] Rep. of Korea ...................... 96-26373

[51] Int. Cl.⁶ .................................... H01L 29/04
[52] U.S. Cl. .......................... 257/347; 257/348; 257/349; 257/350; 257/351; 257/252; 257/353; 257/354; 257/901; 438/149; 438/150; 438/151; 438/152; 438/153; 438/154
[58] Field of Search ..................... 257/347–354, 257/66, 72, 365, 393, 903, 904; 438/149–154

[56] References Cited

U.S. PATENT DOCUMENTS

| | | | |
|---|---|---|---|
| 5,315,132 | 5/1994 | Yamazaki | 257/347 |
| 5,489,792 | 2/1996 | Hu et al. | . |
| 5,604,360 | 2/1997 | Zhang et al. | 257/347 |

FOREIGN PATENT DOCUMENTS

| | | | |
|---|---|---|---|
| 359107563 | 6/1984 | Japan | 257/904 |
| 5347412 | 12/1993 | Japan | . |
| 6244416 | 9/1994 | Japan | . |

*Primary Examiner*—Fetsum Abraham
*Attorney, Agent, or Firm*—Ware, Fressola, Van Der Sluys & Adolphson LLP

[57] ABSTRACT

Disclosed is a semiconductor device having a silicon on insulator structure capable of achieving a high integration, and a manufacturing method of the same. The semiconductor device includes a semiconductor substrate having a silicon on insulator structure, in which a insulating layer and a semiconductor layer are formed on a semiconductor wafer in sequence. A gate insulating film and a gate are formed on the semiconductor layer. A first impurity diffusion region and a second impurity diffusion region are formed in the semiconductor layer at both sides of the gate. A intermediate insulating layer having a first contact hole for exposing a predetermined portion of the first impurity diffusion region and a second contact hole for exposing a predetermined portion of the second impurity diffusion region and a predetermined portion of the wafer, is formed on an overall surface of the substrate. A first interconnection layer is electrically connected with the first impurity diffusion region through the first contact hole, and a second interconnection layer is electrically connected with the second impurity diffusion region and the predetermined portion of the wafer through the second contact hole.

5 Claims, 3 Drawing Sheets

SEMICONDUCTOR DEVICE HAVING A SOI STRUCTURE WITH SUBSTRATE BIAS FORMED THROUGH THE INSULATOR AND IN CONTACT WITH ONE OF THE ACTIVE DIFFUSION LAYERS

BACKGROUND OF THE INVENTION

1. Field of the Invention

The present invention relates to a semiconductor device and a manufacturing method thereof, and more particularly to a semiconductor device having a silicon on insulator (hereinafter simply referred to as "SOI") structure capable of achieving a high integration, and a manufacturing method thereof.

2. Description of the Prior Art

As shown in a CMOS device in which an element is formed in a well of a semiconductor wafer, a positive parasitic effect of a parasitic MOS transistor or a parasitic bipolar transistor is generated from a P-N junction separating structure. As a result, a latch-up phenomenon is generated whereby the device is destroyed or a soft error is generated.

In order to solve the foregoing problems and to accomplish a high integration, a semiconductor device having a SOI structure has been developed. In the SOI structure, a insulating layer is formed on a semiconductor substrate and a semiconductor layer is formed on the insulating layer. On the semiconductor layer, elements can be formed at predetermined regions. The semiconductor substrate is isolated from the regions by the insulating layer. Thereby, it is possible to completely separate the elements and to operate the semiconductor device at high speeds.

FIG. 1 is a sectional view of a conventional MOS transistor having a SOI structure. As shown in FIG. 1, by forming a insulating layer 2 and a semiconductor layer 3 on a semiconductor wafer 1 in sequence, a semiconductor substrate having the SOI structure is formed. Field oxidation films 4 are formed on the semiconductor layer 3. A gate insulating film 5 and a gate 6 are formed on the semiconductor layer 3 between the field oxidation films 4. A source region 7a and a drain region 7b are formed in the semiconductor layer 3. A intermediate Insulating layer 8 have contact holes for exposing predetermined portions of the source region 7a and the drain region 7b. In addition, a source electrode 9a and a drain electrode 9b are formed on the intermediate insulating layer 8. The source electrode 9a and the drain electrode 9b are brought into contact with the source region 7a and the drain region 7b through the contact holes.

In the MOS transistor having the SOI structure as described above, the source electrode 9a or the drain electrode 9b, an individual source or an individual drain of other MOS transistors are connected with a VSS or a VDD through a separate interconnection line.

Since density of the interconnections increases according to the high integration of the semiconductor device, the VSS or the VDD interconnection line is an obstacle to achieving high integration.

SUMMARY OF THE INVENTION

The present invention is provided to solve the foregoing problems. It is a first object of the present invention to provide a semiconductor device capable of accomplishing a high integration by decreasing interconnection density. In addition, it is a second object of the present invention to provide a manufacturing method of a semiconductor device capable of accomplishing a high integration by decreasing interconnection density.

In order to achieve the first object, the present invention provides a semiconductor device having a SOI structure substrate in which a insulating layer and a semiconductor layer are formed on a semiconductor wafer in sequence, the semiconductor device having: a gate insulating film and a gate being formed on the semiconductor layer; a first and a second impurity diffusion region being formed in the semiconductor layer at the both sides of the gate; a intermediate insulating layer for insulating the gate from the first and the second impurity diffusion region, and having a first contact hole for exposing a predetermined portion of the first impurity diffusion region and a second contact hole for exposing a predetermined portion of the second impurity diffusion region and a predetermined portion of the wafer, the intermediate insulating layer being formed on an overall surface of the substrate; a first interconnection layer being electrically connected with the first impurity diffusion region through the first contact hole; and a second interconnection layer being electrically connected with the second impurity diffusion region and the predetermined portion of the wafer through the first contact hole.

In addition, in order to achieve the second object, there is provided a method of manufacturing a semiconductor device having a SOI structure substrate in which a insulating layer and a semiconductor layer are formed on a semiconductor wafer in sequence, a gate insulating film and a gate are formed on the substrate, and a first and a second impurity diffusion region are formed in the semiconductor layer at the both sides of the gate, the method having the steps of: forming a intermediate insulating layer on the overall surface of substrate; forming a first contact hole for exposing a predetermined portion of the first impurity diffusion region, and a second contact hole for exposing a predetermined portion of the second impurity diffusion region and a predetermined portion of the wafer; forming a metal layer on the intermediate insulating layer so that the first and the second contact hole are filled with the metal layer; and forming a first interconnection layer and a second interconnection layer by patterning the metal layer so that the first interconnection layer is connected with the first impurity diffusion region through the first contact hole, and the second interconnection layer is connected with the second impurity diffusion region and the predetermined portion of the wafer through the second contact hole.

As described above, in the preferred embodiment according to the present invention, the impurities diffusion regions such as the source regions or the drain regions are connected with each other in the semiconductor wafer. Therefore, the source regions or the drain regions are connected with other source regions or other drain regions which are formed in other active regions. Accordingly, it is unnecessary to connect the source regions with other source regions or to connect the drain regions with other the drain regions by using a separate VSS interconnection line or a separate VDD interconnection line.

BRIEF DESCRIPTION OF THE DRAWINGS

The above object and other characteristics and advantages of the present invention will become more apparent by describing in detail a preferred embodiment thereof with reference to the attached drawings, in which.

DETAILED DESCRIPTION OF THE INVENTION

Hereinafter, the manufacturing method of a MOS transistor having a SOI structure according to the preferred embodiment of the present invention will be explained in more detail with reference to FIGS. 2A to 2F.

Figure 1:
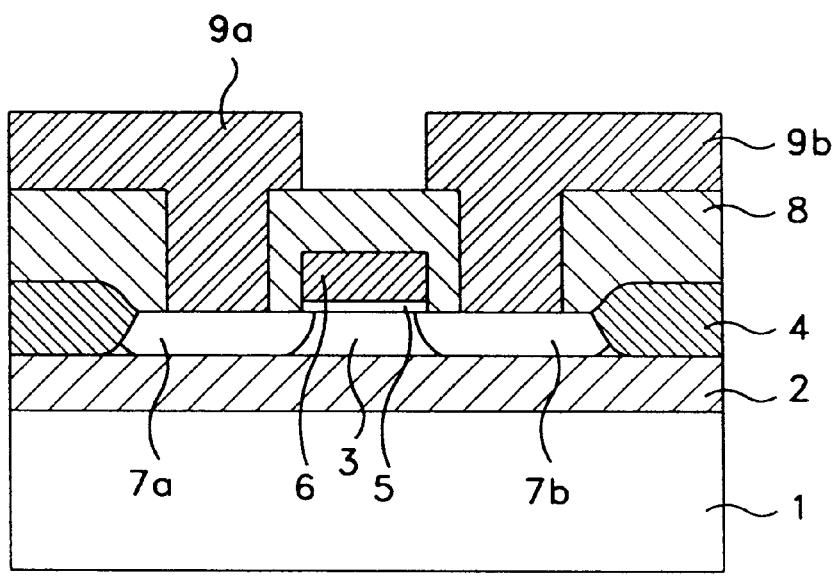
FIG. 1 is a sectional view of a conventional MOS transistor having a SOI structure.
Figure 2A:
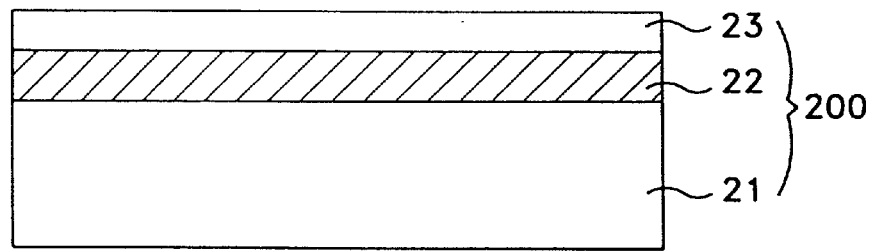
FIGS. 2A to 2F are sectional views of a MOS transistor having a SOI structure according to the present invention, showing a manufacturing method of the MOS transistor having the SOI structure.

As shown in FIG. 2A, a insulating film 22 is formed on a semiconductor wafer 21, and a semiconductor layer 23 is formed on the insulating layer 22. As a result, a semiconductor substrate 200 having a SOI structure is formed. Preferably, the semiconductor wafer 21 is a silicon substrate.

Meanwhile, the first conductive type impurities such as P-type or N-type impurities are doped into the wafer 21 and the semiconductor layer 23. When the P-type impurities are doped into the wafer 21 and the semiconductor layer 23, B ions are used as the P-type impurities at the doping concentration of $5 \times 10^{16}$ to $5 \times 10^{18}$ ions/cm$^3$. Further, when the N-type impurities are doped into the wafer 21 and the semiconductor layer 23, P ions are used as the N-type impurities at the doping concentration of $5 \times 10^{15}$ to $5 \times 10^{18}$ ions/cm$^3$.

Figure 2B:
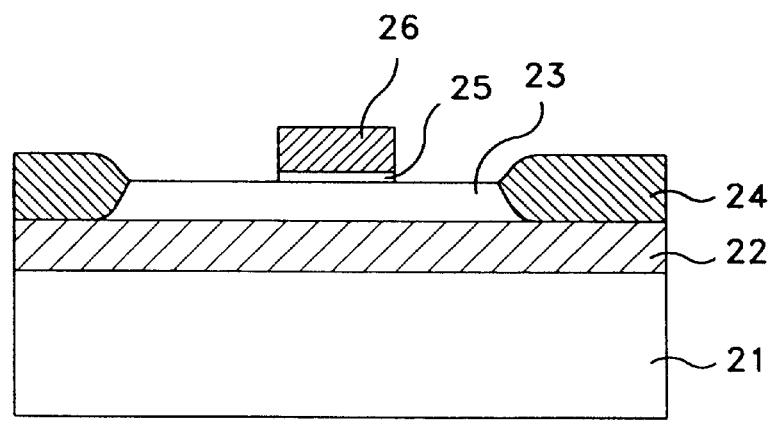

As shown in FIG. 2B, field oxidation films 24 for isolating elements with each other are formed on predetermined portions of the semiconductor layer 23. Thereby, it is possible to define an active region of the MOS transistor. Thereafter, an insulating film and a polysilicon film are deposited on the semiconductor substrate in sequence and patterned. As a result, a gate insulating film 25 and a gate 26 are formed on the semiconductor layer 23 between the field oxidation films 24.

Figure 2C:
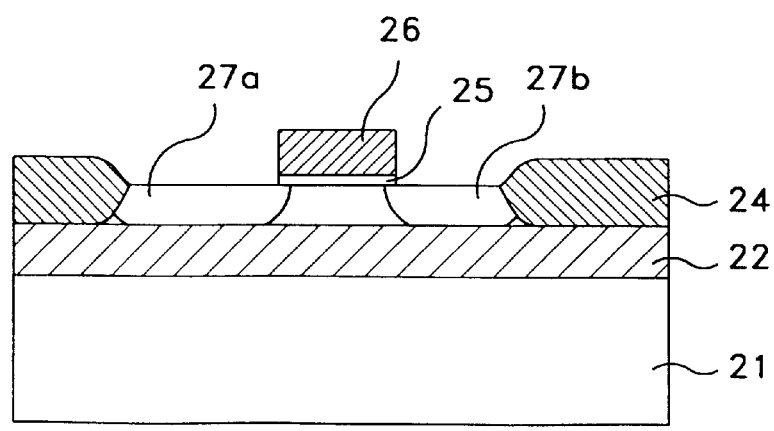

As shown in FIG. 2C, impurity diffusion regions 27a and 27b are formed in the semiconductor layer 23 by implanting the second conductive type impurities such as P-type or N-type impurities, which are opposite in conductivity to the first conductive type impurities, into the semiconductor layer 23 at both sides of the gate 26. The impurity diffusion regions 27a and 27b function as a source region and a drain region of the MOS transistor.

Figure 2D:
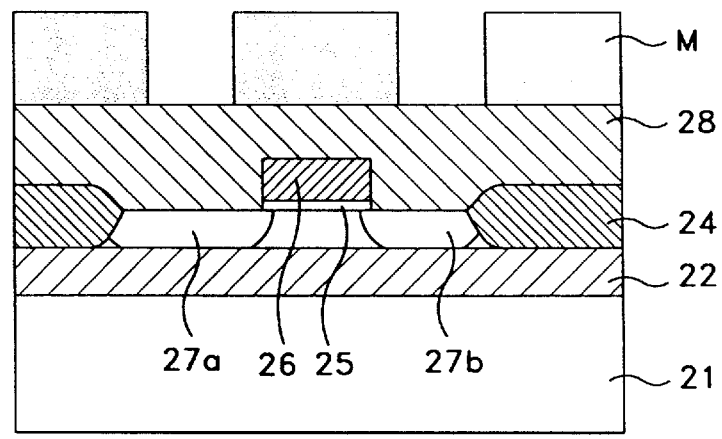

As shown in FIG. 2D, a intermediate insulating film 28 is formed on the structure illustrated in FIG. 2C. Then, a predetermined mask pattern M are formed on the intermediate insulating film 28 by using the photolithography technique.

Figure 2E:
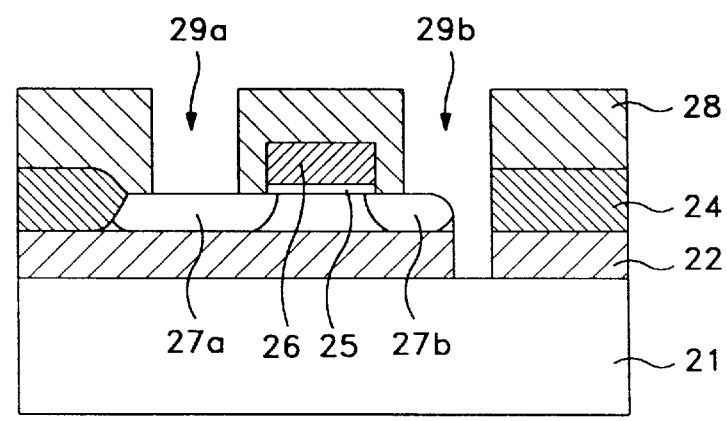

As shown in FIG. 2E, the intermediate insulating layer 28 is etched by using an etching technique in which the mask pattern M is used as an etching mask. Thereby, the predetermined portions of the impurities diffusion regions 27a and 27b are exposed. Further, the field oxidation film 24 adjacent to the impurities diffusion region 27b and the insulating layer 22 below the field oxidation film 24 are etched. As a result, predetermined portions of the semiconductor wafer 21 are exposed and contact holes 29a, 29b are formed.

Figure 2F:
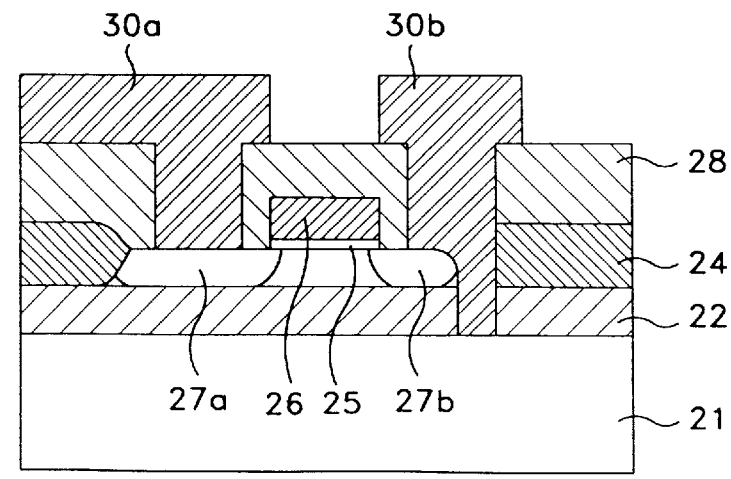

As shown in FIG. 2F, the mask patterns M are removed, and a metal layer is deposited on the intermediate insulating layer 28 whereby, the metal layer fills the contact holes 29a and 29b. Then, the metal layer is patterned, thereby a first metal interconnection layer 30a and a second metal interconnection layer 30b are formed. The first metal interconnection layer 30a is brought into contact with the impurities diffusion region 27a, and the second metal interconnection layer 30b is brought into contact with the impurities diffusion region 27a and the wafer 21.

As described above, in the preferred embodiment according to the present invention, the impurities diffusion regions such as the source regions or the drain regions are connected to each other in the semiconductor wafer. Therefore, the source regions or the drain regions are connected with other source regions or other drain regions which are formed in other active regions. Accordingly, it is unnecessary to connect the source regions with other source regions or to connect the drain regions with other the drain regions by using a VSS interconnection line or a VDD interconnection line.

Accordingly, as the density of the wiring decreased, the high integration of the semiconductor device can be accomplished. Furthermore, the throughput is enhanced and the yield is enhanced.

While the present invention has been particularly shown and described with reference to a particular embodiment thereof, it will be understood by those skilled in the art that various changes in form and detail may be effected therein without departing from the spirit and scope of the invention as defined by the appended claims.

What is claimed is:

1. A semiconductor device having an SOI structure substrate in which an insulating layer and a semiconductor layer are formed on a semiconductor wafer in sequence, said semiconductor device comprising:

a gate insulating film and a gate being formed on the semiconductor layer;

a first and a second impurity diffusion region being formed in the semiconductor layer at both sides of said gate;

an intermediate insulating layer being formed on an overall surface of the substrate, and having a first contact hole for exposing a predetermined portion of said first impurity diffusion region and a second contact hole for exposing a predetermined portion of said second impurity diffusion region and a predetermined portion of the wafer through a hole in the insulating layer;

a first interconnection layer being electrically connected with said first impurity diffusion region through said first contact hole and extending onto an upper surface of said intermediate insulating layer; and a second interconnection layer being electrically connected with said second impurity diffusion region and the predetermined portion of the wafer through said second contact hole and extending onto an upper surface of said intermediate insulating layer.

2. The semiconductor device as claimed in claim 1, wherein said first impurity diffusion region is a drain region, and said second impurity diffusion region is a source region.

3. The semiconductor device as claimed in claim 2, wherein said second interconnection layer is a VSS interconnection line which is connected with said source region.

4. The semiconductor device as claimed in claim 1, wherein said first impurity diffusion region is a source region, and said second impurity diffusion region is a drain region.

5. The semiconductor device as claimed in claim 4, wherein said second interconnection layer is a VDD interconnection line which is connected with said drain region.

* * * * *